United States Patent [19]

Collins et al.

[11] 4,028,150

[45] June 7, 1977

[54] METHOD FOR MAKING RELIABLE MOSFET DEVICE

[75] Inventors: Robert Henry Collins, Wappingers Falls; Richard F. Levine; William D. North, both of Poughkeepsie; Gerald D. O'Rourke, Poughkeepsie; Gerald R. Parker, Wappingers Falls, all of N.Y.

[73] Assignee: IBM Corporation, Armonk, N.Y.

[22] Filed: Feb. 9, 1976

[21] Appl. No.: 656,222

Related U.S. Application Data

[62] Division of Ser. No. 357,046, May 3, 1973, abandoned.

[52] U.S. Cl. .................... 148/187; 148/188
[51] Int. Cl.² ........................ H01L 21/22
[58] Field of Search .................. 148/187, 188

[56] References Cited

UNITED STATES PATENTS

| | | | |
|---|---|---|---|
| 3,300,339 | 1/1967 | Perri et al. | 148/187 X |
| 3,343,049 | 9/1967 | Miller et al. | 148/187 X |
| 3,476,619 | 11/1969 | Tolliver | 148/187 |
| 3,497,407 | 2/1970 | Esch et al. | 148/187 X |
| 3,507,716 | 4/1970 | Nishida et al. | 148/187 |
| 3,512,057 | 5/1970 | Hatcher, Jr. | 148/187 UX |
| 3,560,810 | 2/1971 | Balk et al. | 148/187 UX |

Primary Examiner—L. Dewayne Rutledge
Assistant Examiner—J. M. Davis
Attorney, Agent, or Firm—Thomas F. Galvin

[57] ABSTRACT

A substantial increase in the reliability of metal-oxide-semiconductor field effect transistor (MOSFET) devices having a thin gate dielectric is achieved by providing a thin film of phosphosilicate glass (PSG) on the thin dielectric and completely covering the PSG layer with the gate metallization. The metallization extends over a thick film of phosphosilicate glass which is disposed on the thick insulator covering the source and drain regions.

4 Claims, 15 Drawing Figures

METHOD FOR MAKING RELIABLE MOSFET DEVICE

CROSS REFERENCE TO A RELATED APPLICATION

This is a division of application Ser. No. 357,046 filed May 3, 1973, now abandoned.

C. A. Barile et al., Ser. No. 308,608 filed Nov. 21, 1972 and assigned to the same assignee as the present application.

BACKGROUND OF THE INVENTION

1. Field of the Invention

This invention relates to field effect transistor devices. In particular it relates to reducing the failure rate of such devices.

2. Description of the Prior Art

In recent years the field effect transistor (FET) has progressed from limited utility to a full-scale product technology. At the present time, numerous memory and logic systems utilize this technology. The technological advantages inherent in FET's, such as low power and high-packaging density, have made large scale integration (LSI) a reality. In fact, the FET is rapidly replacing the bipolar transistor as the preferred technology for LSI systems.

When any new technology is implemented, new methods of manufacture often have to be developed; and the reliability of these processes and the resulting product must be assured. Unlike the bipolar transistor, the FET is a surface device and is sensitive to a different set of processing variables, e.g., charge control and gate insulator integrity.

One type of FET which has shown great promise is the metal-oxide-semiconductor field effect transistor (MOSFET) which utilizes a composite gate dielectric of silicon dioxide-phosphosilicate glass. The advantages of such a composite gate dielectric have been described by Miller and Barson in U.S. Pat. No. 3,343,049, assigned to the same assignee as the present invention. FET's utilizing silicon dioxide alone as the gate dielectric experience undesirable shifts in one or more of their operating characteristics or qualities at medium and high operating temperatures when operated under their usual bias conditions for extended periods of time. In the ambient environment of the systems in which these devices are used, e.g., data processing storage systems, such shifts are unacceptable. In general, devices exhibiting these shifts must be rejected as unsuitable. Because many hundreds or thousands of such devices are today formed in the same semiconductor substrate, the cost of even a single reject may be quite substantial. The alternatives open to the manufacturing engineer are to reject the entire chip or wafer or to probe the device, isolate the defective devices and insure that they are not used in an operating environment. Either alternative is quite expensive and has delayed or completely halted the introduction of improved semiconductor devices.

In the above described patent, Miller and Barson arrived at a solution to the parameter shift problem which significantly advanced the art. They found that the use of a vitreous film of a mixture of silicon oxide and phosphorus pentoxide ($P_2O_5$) substantially improved the electrical qualities of the field effect transistor devices.

Although the physics of the improvement achieved by adding phosphosilicate glass was not fully understood by Miller and Barson at the time of filing their application, more recently it has been shown that phosphosilicate glass (PSG) is particularly effective in reducing the rate of degradation of threshold voltage due to positive ion contamination drift, thought to be sodium ($Na^+$). The trapping mechanism of a PSG film is believed to be a coulombic attraction between a non-bridging oxygen ion ($O^-$) and the mobile contamination ion ($Na^+$).

It has been found that the thicker the layer of PSG, and the greater the mole precent of $P_2O_5$ it contains, the more stable will be the device. (The PSG acts as a contaminant trap.) On the other hand, too thick a layer leads to PSG polarization shifts of undesirable proportions. Too little PSG doesn't trap enough contaminants to assure reliability.

For example, we have found that production lots of 512 bit memory array chips, each containing about 4000 gates consisting of 600 A $SiO_2$ and 100 A PSG gate insulation, exhibited an unexpectedly high number of failures. The failures fell into two principal categories: (1) gate shorts and (2) severe threshold voltage ($V_T$) shifts. A gate short is a breakdown of the thin gate insulator which is electrically characterized as a catastrophic, permanent failure under stress.

The $V_T$ shift ($\Delta V_T$) caused a N channel enhancement mode device to operate in the depletion mode. In other words, a normally "off" device becomes normally "on". The shift was detected on chips which were stressed under standard "worst case" conditions for relatively short times, i.e., a gate voltage of around 11 volts at 130° C ambient temperature for 100 hours. The failing units exhibit no change in input leakage or general threshold degradation, indicating that the failures are not inherent in the FET technology.

SUMMARY OF THE INVENTION

It is therefore an object of this invention to improve the reliability of field effect devices.

It is a further object of this invention to manufacture field effect transistors on a large scale integrated basis which maintain long term stability in operating environments.

These and other objects are achieved by forming a thin PSG layer over the gate region, insuring that the thin PSG is completely covered by the gate metallization, and extending the metallization over a thick PSG area over the source and drain regions.

In the preferred embodiment of the invention, the gate insulator is a thin composite layer of silicon dioxide-PSG: and the insulation region surrounding said composite is another composite layer of relatively thick oxide and PSG. The PSG acts as a means for trapping ionic contaminants.

Extensive testing has indicated that the incomplete coverage of the gate composite insulator allows contaminants to propogate into the gate region in the substrate through the exposed thin PSG area. If the metallization coverage is very poor, a gate short results; if the coverage is marginally poor the contaminants adversely affect $V_T$, particularly in N channel devices.

DESCRIPTION OF THE INVENTION

Figure 1A:
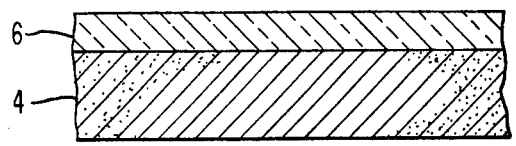
FIGS. 1A–1H are cross-sectional views of the steps of fabricating a field effect device in accordance with the present invention.

FIG. 1A shows a semiconductor substrate 4 which comprises P type silicon in the < 100 > crystallographic orientation and having a typical resistivity of between 1.8–2.4 ohms-cm. A thick oxide layer 6 is formed over the surface of substrate 4. Insulator 6 is preferably thermally grown silicon dioxide having a thickness of 5400 A ± 500 A; a range of from 5000 A to 7500 A has been used.

Figure 1B:
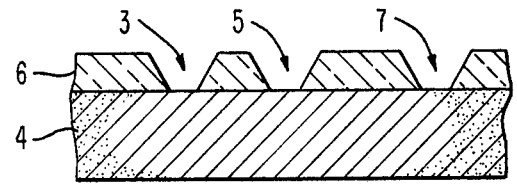

In FIG. 1B, windows 3, 5 and 7 have been carved out of oxide layer 6 to expose areas for the source, drain and contact regions of a FET to be formed in silicon substrate 4. The openings are formed by conventional photoresist techniques.

Figure 1C:
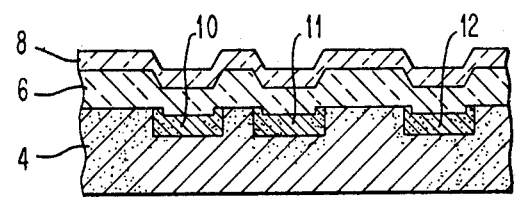

FIG. 1C illustrates the process after the source, drain and contact regions 1, 11 and 12, respectively have been diffused into windows 3, 5 and 7, repsectively. After the diffusion, the windows are reoxidized and a layer of phosphosilicate glass 8 is formed on the surface of oxide 6. Diffusions 10, 11 and 12 are preferably phosphorus having a sheet resistivity of between 8–18 ohms per square.

The preferred diffusion process occurs in a dynamic reactor into which is introduced phosphorus oxychloride (PO Cl$_3$) in a nitrogen carrier gas. Oxygen is present in the reactor, resulting in the deposition of phosphorus pentoxide (P$_2$O$_5$) on the surfaces of the wafers. At this point a reoxidation and drive-in step is performed, driving phosphorus into regions 10, 11 and 12 and regrowing an oxide layer at the same time by the introduction of dry oxygen or steam at an elevated temperature.

The result is that the portions of layer 8 directly overlying substrate 4 both build up an oxide layer 6 and also penetrate into that layer somewhat to change the composition of the outer surface. Chemical analysis indicates that layer 8 is P$_2$O$_5$—SiO$_2$, commonly known as PSG. On the other hand, the portions of the insulating layer directly overlying the source, drain and contact regions are a more uniform composite of PSG and SiO$_2$. In combination with the thin PSG film over channel region 9, the thick PSG composite over source, drain and contact regions 10, 11 and 12 is very important in ensuring reliability as it serves to trap contaminants which might penetrate through areas not protected by metallization.

Figure 1D:
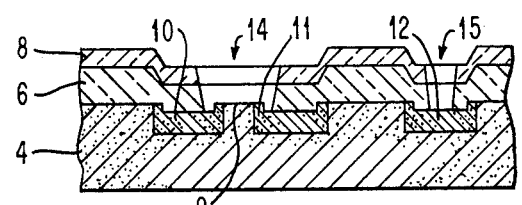

Having formed the source, drain and contact regions, the gate pattern is now etched over the channel between source 10 and drain 11. In addition, as shown in FIG. 1D an opening to contact region 12 is made simultaneously.

An important phenomenon occurring when the composite thick oxide layer 6 is etched is the difference in etch rate in the direction along the surface of the substrate 4 (X direction) as compared to the etch rate perpendicular to the surface (Y direction). If oxide layer 6 were drawn on the same scale for the X and Y directions, then the etch angle would be expected to equal 45°. However, in point of fact, the etch rates are not the same and the angle $\theta$ ordinarily will occur in practice between 10 ° and 30°. Due to problems of scale in drawing semiconductor devices, the angle cannot be illustrated satisfactorily in drawings such as FIG. 1D. As in virtually all drawings of semiconductor devices in the literature, the scale in the X direction is greatly compressed as compared to the Y direction for purposes of better comprehension. A better illustration will be given in a later section of this specification.

Figure 1E:
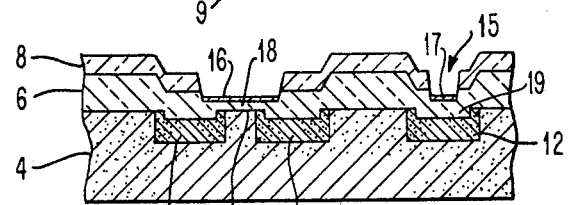

FIG. 1E illustrates the formation of the thin composite insulation and passivation layer over the gate region. The composite comprises a layer of SiO$_2$ 18 and PSG 16. The oxide layer is grown to form around 675 A of SiO$_2$. The preferred range of SiO$_2$ is 500–750 A. This forms the insulation between the metallization to be deposited and the channel region 9 in substrate 4. After the growth of SiO$_2$, a thin layer of PSG is formed for purposes of stabilization by the process already alluded to. The PSG layer has a thickness of 110 A ± 20 A and comprises around 4.5 mole % ± 1.5% phosphorus. For ease of processing, the surface of contact region 12 is also covered with a thin oxide layer 19 and PSG layer 17 which are formed in the same steps as layers 18 and 16 respectively.

Figure 1F:
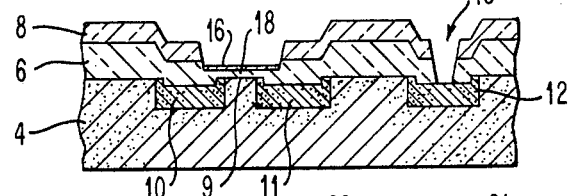

In FIG. 1F, layers 19 and 17 are removed by conventional etching steps to reopen contact region 12.

Figure 1G:
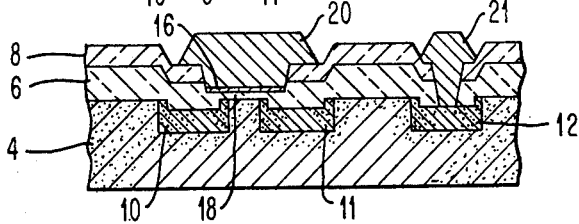

FIG. 1G illustrates an important step in the process which is critical in the fabrication of a highly reliable device. In FIG. 1G, the gate electrode 20 and the contact electrode 21 are shown in position over the gate region and the contact region 12, respectively. It is noted that the gate electrode 20 extends over the thick phosphosilicate glass layer 8, thereby providing a continuous barrier to contaminants which might infiltrate the thin gate insulator. Similarly, contact electrode 21 is also over the thick PSG layer surrounding the contact region for substantially the same reason.

The gate and contact electrodes are preferably formed by a "subtractive etching" step. In this process a blanket of metal is deposited over the entire substrate. The regions over which the electrodes are to remain are masked and the metal and all other areas on the substrate is removed by conventional etching step. The preferred electrode in this invention comprises around 10,000 A of an alloy of aluminum-copper containing 4.5% $\mp$ 1.5% copper. However, other electrodes may be used, including a metal such as molybdenum or polycrystalline silicon which is suitably doped to be conductive. For example, polycrystalline silicon which is doped with phosphorus having a surface concentration of around $10^{19}$ atoms per cm$^3$ is satisfactory. The important consideration is that the metallization extends over the thick PSG layer 8, thereby insuring that the thin PSG layer 16 is completely covered by electrode 20. Test results illustrating the importance of this coverage are described in detail in a succeeding portion of this specification.

Figure 1H:
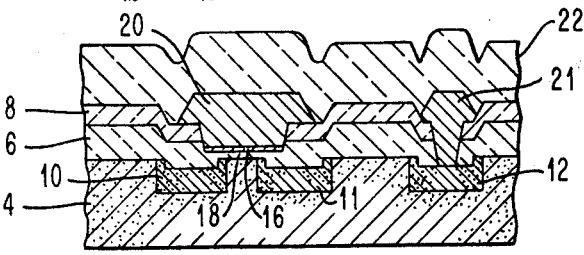

In FIG. 1H, a quartz coating 22 is deposited over the device as a protective medium. The quartz may act as a source of contamination to the active device area.

THRESHOLD STABILITY IMPROVEMENT

Although various types of threshold voltage instabilities are known, the most serious instability mechanism associated with N channel FET processing is positive ion drift. As already noted PSG is effective in reducing the rate of degradation of threshold voltage due to contamination drift such as sodium ions. However, the addition of PSG introduces another instability mechanism, i.e. PSG polarization. Thus the threshold stability is controlled by the relative interaction of two variables, the number of mobile contamination ions and the PSG parameters of mole percent the thickness.

In the present FET structure we have found that the best stability results when the thickness of the thin oxide layer 18 is around 700 A and when the mole % of thin oxide PSG which is deposited is approximately 4.5 mole % at a thickness of around 100 A. As compared to lower values of thin oxide thickness, such as 500 A, the thicker oxide reduces the stress field for a given operating voltage; the value or 4.5 mole % as compared to a lower mole % of PSG increases resistance to instability due to ion drift. This also increases the PSG polarization term but is somewhat compensated for by the increase in the thin oxide thickness to 700 A. Overall, however, the contamination level of ions which are prevented from interfering with the operation of the device is increased.

The combination of the specific design of the composite gate insulator and the thick composite insulation, as well as the complete coverage of the gate region by the metallization results in a highly stable, reliable device. The thin PSG layer formed atop the thin oxide layer acts as a contaminant trap; and the metallization prevents the introduction of other contaminants into the composite region and the active regions of the device. As previously noted, the thick PSG layer prevents contaminants from penetrating the active regions through surface areas unprotected by the metallization.

Figure 2:
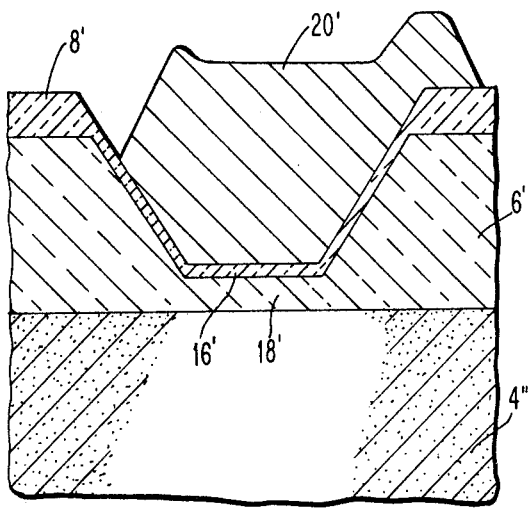
FIGS. 2 and 3 are cross-sectional views of defective devices.
Figure 3:
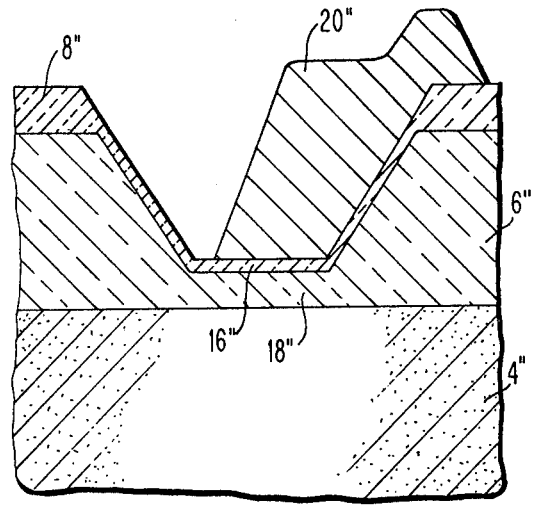

FIGS. 2 and 3 illustrate FET devices having marginal coverage of the gate insulator and poor coverage. respectively. In FIG. 2, metallizations 20' covers substantially all of the thin composite gate insulator except for a portion of the thin PSG on the sidewall. In FIG. 3 the coverage is substantially poorer, with both the sidewall and a portion of the horizontal surface of the PSG remaining uncovered.

These defects in coverage are caused by errors in process control such as overetching of the gate windows, overetching the metallization pattern or a misregistration between the masks used for the aluminum gate and the thin oxide gate insulators. In some prior art devices featuring oxide dielectrics, the design ground-rules themselves cause the lack of complete coverage. As shown, in FIGS. 2 and 3, the consequence of these process control errors is a more or less severe inadequacy of coverage of the thin oxide 16, leading to device failure.

Extensive testing of these inadequately covered devices indicates that a failure will not result merely because layer 16 is exposed. There must be a source of contamination present at the inadequately covered gate insulator. It has been found that, under stress, the contaminants, usually positive ions, will move under the gate and degrade the threshold voltage. The failure rate is a function both of the composite layer 16/18 exposure and the amount of contamination. For example, it has been found that not all of the devices which have inadequate metallization coverage will fail. Thus, a program which would reduce or eliminate the sources of contamination would also result in higher yields. However, this is a very difficult solution to achieve. Contaminants emanate from a number of sources, some of which are not controllable at the present state of the art. For example, quartz coating 22 is known to contain mobile positive charges; and contaminants may be introduced into the devices both before or during glassing. In addition, contaminant sources may result from residue such as photoresist or foreign debris which have collected in the tiny crevices created by the inadequate coverage of the metallization. These sources of contamination would be, from a financial standpoint, practically impossible to correct. The assurance of adequate metallization coverage over the thin composite insulator, on the other hand, can be provided much more easily within the state of the art of quality assurance manufacturing techniques.

To further explain the criticality of complete coverage of the thin composite insulator 16/18, the results of stress tests on both good and defective devices will be discussed. The technique of stressing field effect devices to predict their future behavior and to detect defects is known to those of skill in this art. For those who are as yet unfamiliar with this technique, reference is made to the application of C. A. Barile et al. Ser. No. 308,608, filed Nov. 21, 1972, now U.S. Pat. No. 3,793,090 and assigned to the assignee of the present invention. This previous application is hereby made of reference in the present application. In general, the stressing process involves applying a potential, generally denoted as $V_{stress}$, to the gate of the device at a selected ambient temperature. The source, drain and substrate of the device are grounded, although the source and drain might also be left floating. The value of the threshold voltage of the device is measured before and after stressing, to arrive at the threshold voltage shift, $\Delta V_T$.

In one test on a production lot of devices, we found that both adequately covered and inadequately covered (anomalous) devices behaved similarly for early hours of stress, i.e., less than 70 hours. After that period, the threshold voltage, $V_T$, of the anomalous devices only degraded rapidly. The stress voltage, $V_{STRESS}$, was 11 volts and the ambient temperature was 130° C. Both sets of devices were then baked for 18 hours at 225° C. After baking, the sets were restressed and the anomalous devices degraded rapidly from the initiation of the stress whereas the good devices behaved as predicted by the standard polarization component of threshold degradation.

Figure 4:
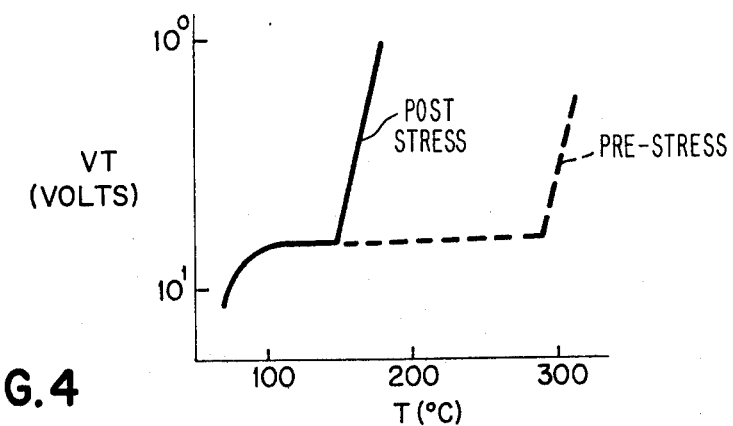
FIG. 4 is a graph illustrating the threshold instability of defective devices.

The results of another test on the anomalous devices is illustrated in FIG. 4, wherein the ambient temperature was varied as shown. FIG. 4 is a graph of the logarithm of the change in threshold voltage, $\Delta V_T$, versus ambient temperature. Under pre-stress conditions, i.e., $V_{STRESS} = 0$, there is a breakpoint at 300° C. at which the change in threshold voltage begins to degrade rapidly. This is illustrated by the dotted curve on the graph. This high break point temperature indicates that there are more PSG trap sites than there are sodium ions in the gate region. However, after stressing at 11 volts, the breakpoint temperature is reduced to 140° C, indicating that the amount of sodium ions present under the gate has increased. As has been previously indicated, this failure occurs only with devices which are inadequately covered by metallization over the gate region.

The conclusions from these tests are that the level of contamination in the gate region of the anomalous devices is substantially increased after stressing which results in a faster degradation rate.

Figure 5:
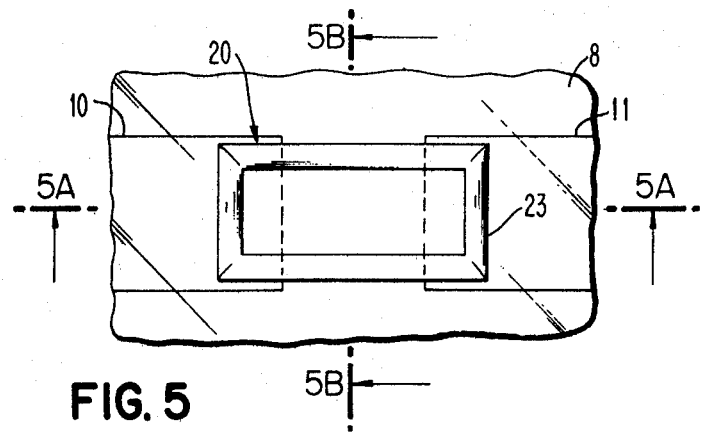
FIGS. 5, 5A and 5B are a plain view and cross-sectional views of the inventive device in FIG. 5 taken along lines 5A—5A and 5B—5B respectively.
Figure 5A:
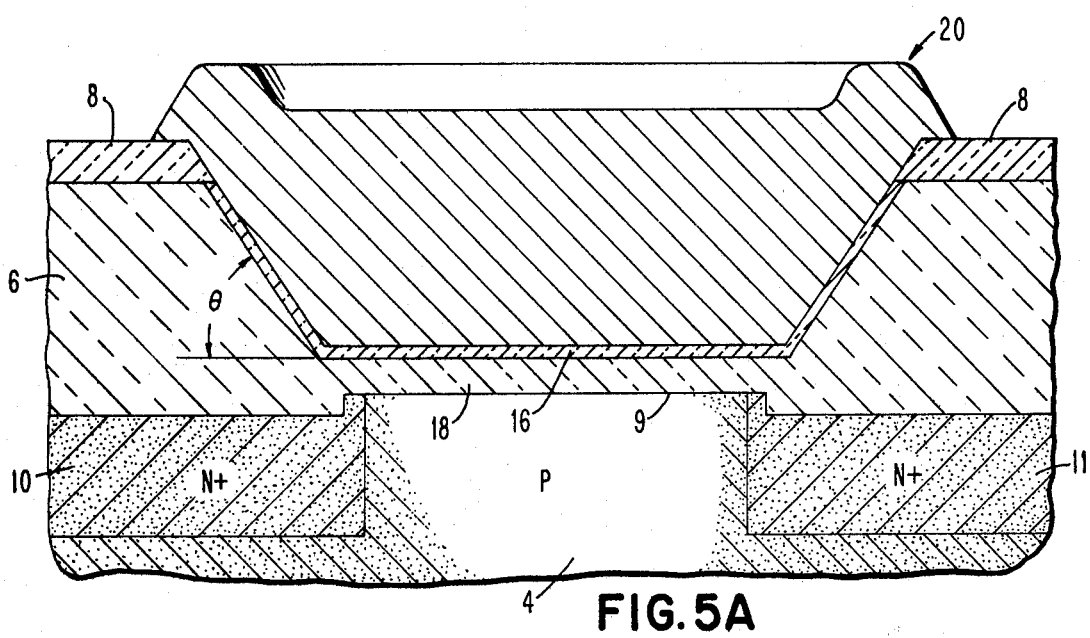
Figure 5B:
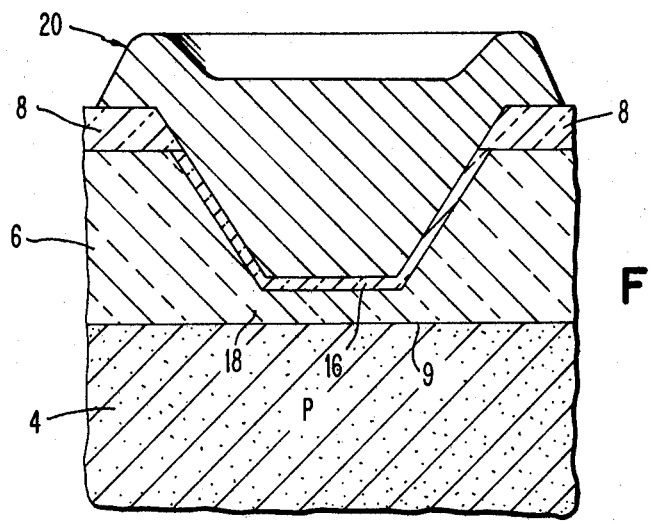

Referring now to FIGS. 5, 5A and 5B, these illustrate more accurately the sidewall angle of a typical FET device fabricated in accordance with the present invention. FIG. 5 is a top surface view of the device showing the aluminum metallization 20 and the source and drain regions 10 and 11, respectively. The outlined portion 23 represents an elevated surface of the metallization which is due to the gradual slope of the sidewall of PSG layer 16. The sidewall is more clearly illustrated in FIG. 5A and it is seen that the slope is of such a magnitude that a substantial portion of the sidewall faces the horizontal surface of the device rather than being normal to it. The slope of the sidewall is illustrated in FIG. 5A as the angle $\theta$. In a typical field effect device $\theta$ equals 10°–30°. It is seen that this PSG layer 16' takes up a significant area over source and drain regions 10 and 11. Thus, contaminants can drift into these regions as well as channel 9 to deleteriously affect device operation.

Figure 6:
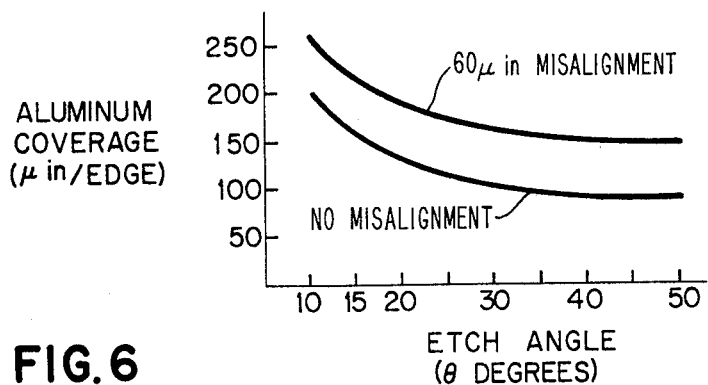
FIG. 6 is a graph indicating the amount of coverage of the gate insulator needed to assure a non-defective device.

The low slope of the sidewall requires that the amount of metallization coverage be carefully calculated to take the slope into effect. If the slope of the SiO$_2$ layer 6 were 90° (perfectly vertical), as is the slope of thick PSG layer 8, then there would be no problem. However, there is a finite distance between the edge of the horizontal portion of PSG layer 16 and the beginning of PSG layer 8. For convenience, this distance is treated as "edge coverage" over thick PSG layer 8, although it is really part of the metallization directly over PSG layer 16. Illustrated in FIG. 6 is a graph of the aluminum coverage design values over each edge of the thick PSG layer versus the etch angle $\theta$. The lower curve assumes that there is no misalignment of the mask which is used to form the metallization layer 20 in the process. One parameter determining the aluminum coverage is the etch tolerance, existing in all processes, which is approximately 25 microinches. Also included is the etching back of the gate metal which is approximately 25 microinches per edge. A third factor is the desired overlap, which is approximately equal to 15 microinches. In a typical case these factors add up to a tolerance of 75 microinches, which is generally invariant for the same manufacturing process.

The other significant variable, as stated above, is a function of the sidewall angle $\theta$. The sidewall angle of the PSG depends on the mole percent of PSG, the thickness of the PSG layer 16 and the thickness, $t_{ox}$, of the SiO$_2$ layer 6. The amount required can be determined trigonometrically by the formula:

$$B = t_{ox} / \tan \theta$$

Typically where $\theta = 20°$ and $t_{ox} = 5300$ M, B = 60 microinches. Thus, on the curve, the edge coverage is around 135 microinches. This amount must be added to the amount needed to cover the horizontal surface of PSG layer 16, which is typically 325 microinches. The upper curve in FIG. 6 assumes a 60 microinch misalignment of the mask used to form layer 20.

While the invention has been particularly shown and described with reference to preferred embodiments thereof, it will be understood by those skilled in the art that the foregoing and other changes in form and details may be made therein without departing from the spirit and scope of the invention. For example, although the invention has been described with particular reference to N channel devices, it is also applicable to P channel devices for protection against gate shorts.

What is claimed is:

1. A method for fabricating a field effect transistor, in which the active regions of the transistor are protected against contamination, comprising the steps of:
    forming a silicon dioxide coating on a surface of a silicon semiconductor substrate;
    removing portions of said coating to expose spaced adjacent regions in the substrate;
    depositing phosphorus pentoxide on the oxide coating and on said exposed regions;
    heating the substrate in an oxygen atmosphere to cause phosphorus to diffuse into said exposed adjacent regions, thereby forming source and drain regions of a field effect transisitor, and also a relatively thick composite insulator layer, over said exposed source and drain regions, of silicon dioxide and phosphosilicate glass;
    exposing a channel region between said source and drain regions;
    forming a thin coating of silicon dioxide over said exposed channel region;
    forming a thin layer of phosphosilicate glass on said thin oxide; and
    depositing a gate electrode over said thin layer of phosphosilicate glass and over a portion of said thick composite insulator layer.

2. A method as in claim 1 wherein the steps of forming of said silicon oxide coatings comprise thermally growing said oxide from said body.

3. A method for fabricating a field effect transistor, in wich the active regions of the transistor are protected against contamination, comprising the steps of:
    forming a silicon dioxide coating on a surface of a silicon semiconductor substrate;
    removing portions of said coating to expose spaced adjacent regions in the substrate;
    depositing a conductivity determining dopant in said regions, thereby forming source and drain regions of said field effect transisitors;
    reforming a relatively thick layer of silicon dioxide over said source and drain regions;
    forming a relatively thick layer of phosphosilicate glass over said thick insulator layer;
    exposing a channel region between said source and drain regions;
    forming a thin coating of silicon dioxide over said exposed channel region;
    forming a thin layer of phosphosilicate glass on said thin oxide; and
    depositing a gate electrode over said thin layer of phosphosilicate glass and over a portion of said thick layer of phosphosilicate glass.

4. A method as in claim 3 wherein said thick insulator layer is silicon dioxide and wherein the forming of the thick and thin phosphosilicate glass layers is accomplished by heating the semiconductor substrate in an atmosphere containing phosphorus oxychloride and oxygen, thereby depositing phosphorus pentoxide on the surface of the silicon dioxide layers.

* * * * *